United States Patent
Yang et al.

(10) Patent No.: US 8,329,515 B2
(45) Date of Patent: Dec. 11, 2012

(54) EFUSE ENABLEMENT WITH THIN POLYSILICON OR AMORPHOUS-SILICON GATE-STACK FOR HKMG CMOS

(75) Inventors: Bin Yang, Mahwah, NJ (US); Man Fai Ng, Poughkeepsie, NY (US)

(73) Assignee: Globalfoundries Inc., Grand Cayman (KY)

( * ) Notice: Subject to any disclaimer, the term of this patent is extended or adjusted under 35 U.S.C. 154(b) by 280 days.

(21) Appl. No.: 12/647,888

(22) Filed: Dec. 28, 2009

(65) Prior Publication Data

US 2011/0156146 A1 Jun. 30, 2011

(51) Int. Cl.
*H01L 21/82* (2006.01)
(52) U.S. Cl. .......................................... 438/132; 257/350
(58) Field of Classification Search .................. 257/350; 438/132
See application file for complete search history.

(56) References Cited

U.S. PATENT DOCUMENTS

| | | | |
|---|---|---|---|
| 2008/0169529 A1* | 7/2008 | Kim et al. | 257/529 |
| 2010/0059823 A1* | 3/2010 | Chung et al. | 257/355 |
| 2011/0117710 A1* | 5/2011 | Lin et al. | 438/238 |

* cited by examiner

*Primary Examiner* — Shaun Campbell

(74) *Attorney, Agent, or Firm* — Ditthavong Mori & Steiner, P.C.

(57) ABSTRACT

An eFUSE is formed with a gate stack including a layer of embedded silicon germanium (eSiGe) on the polysilicon. An embodiment includes forming a shallow trench isolation (STI) region in a substrate, forming a first gate stack on the substrate for a PMOS device, forming a second gate stack on an STI region for an eFUSE, forming first embedded silicon germanium (eSiGe) on the substrate on first and second sides of the first gate stack, and forming second eSiGe on the second gate stack. The addition of eSiGe to the eFUSE gate stack increases the distance between the eFUSE debris zone and an underlying metal gate, thereby preventing potential shorting.

18 Claims, 5 Drawing Sheets

EFUSE ENABLEMENT WITH THIN POLYSILICON OR AMORPHOUS-SILICON GATE-STACK FOR HKMG CMOS

TECHNICAL FIELD

The present disclosure relates to semiconductor devices with eFUSEs. The present disclosure is particularly applicable to high-K/metal gate (HKMG) semiconductor devices with eFUSEs having a thin polysilicon layer in the gate stack.

BACKGROUND eFUSE technology is commonly used to improve SRAM yield in all CMOS technology nodes. The use of tiny electrical fuses allows engineers to fix a defective part of an SRAM circuit even after front-end-of-line (FEOL) processing, back-end-of-line (BEOL) processing, and packaging. A high-current pulse is passed through the eFUSE so that it can be melted instantly and create a local open, or a high resistance, i.e., greater than 3 kilo ohms (KΩ), through electromigration. The eFUSE is then "blown," the defective SRAM cell is disconnected from the big SRAM array, such as 16 M or 32 M, and an otherwise non-functional SRAM array becomes functional, thereby enhancing SRAM yield.

An eFUSE 101 is normally fabricated as illustrated in FIGS. 1A and 1B. A silicide 103 is formed on the polysilicon 105 of a gate stack 107 (including gate 109 and gate oxide 111) on shallow trench isolation (STI) regions 113 in the active silicon 115. The STI provides good thermal isolation due to the low thermal conductivity of STI oxide, thereby allowing the eFUSE to be blown with minimal current flow through the eFUSE. Low eFUSE current flow is necessary as it consumes less energy and generates the lowest damage to the chip structure as a result of blowing the eFUSE. In addition, the STI surrounding the eFUSE prevents eFUSE debris from forming a conducting path to neighboring materials. In contrast, an eFUSE fabricated with active bulk silicon could form a conducting path through the conducting silicon body when eFUSE debris migrates into the active silicon.

To blow a fuse, a controlled electromigration is introduced such that the top silicided (low resistance) portion of the structure becomes hollow or electrically open, i.e., shows a high resistance. Since the silicon under the silicide is undoped, it has a high resistance. Only very low current goes through resistive silicon. Therefore, the undoped polysilicon layer remains intact during the blowing of the eFUSE, and after the eFUSE is blown, the eFUSE has a high resistance.

With a HKMG CMOS, where a metal gate 109, e.g., of titanium nitride (TiN) is present in the gate stack, the thickness of the undoped polysilicon layer 105 under the silicide 103 is a critical parameter for a reliable eFUSE. If the polysilicon layer remaining after silicidation is too thin, the silicide debris created by blowing the eFUSE can create a conducting path through the TiN 109, as shown by the zone of debris 201 in FIG. 2. As a result, the shorts can prevent the desired high resistance (open) state. As a rule of thumb, for a 32 nanometer (nm) node CMOS eFUSE process, the minimum polysilicon thickness required in the gate stack before silicidation should be greater than about 60 nm, about 25 nm that are consumed by silicide and greater than about 35 nm remaining to separate the silicide from TiN to guarantee that silicide debris does not create a conducting path to the TiN. With device scaling every generation, the polysilicon thickness is becoming thinner and thinner. For example, for a 32 nm node CMOS and also for a 28 nm node CMOS, the polysilicon thickness in the gate stack is about 40 nm to about 60 nm, which is less than the minimum required for an eFUSE.

Efforts to enable an eFUSE with a thin polysilicon (or amorphous silicon) gate stack in 32 nm and 28 nm nodes technologies include an extra patterning step in which the TiN in the eFUSE region is exposed and then removed by a wet etch process. However, the dHF cleaning process used in etching the TiN causes a TiN discontinuity 301 in the polysilicon/STI divot region 303, as illustrated in FIG. 3, which leads to high gate leakage (low Toxgl) for both NMOS and PMOS transistors.

To solve the discontinuous TiN problem, a thicker TiN layer that is less susceptible to discontinuities may be utilized. However, thicker TiN metal is known to create more significant Vt-W issues, and, therefore, is not an option. The eFUSE may also be constructed using active silicon instead of the polysilicon in the gate stack. For a silicon-on-insulator (SOI) CMOS, this does not create further issues. However, for a bulk CMOS (such as a 28 nm node CMOS), because the bulk silicon substrate is a better thermal conductor than STI, it takes significantly more current to blow the eFUSE, which is undesirable. Further, an eFUSE made of active silicon on a bulk substrate has a potential to create a conducting path in the bulk silicon substrate (since there is no buried oxide layer (BOX) beneath the eFUSE to block the conducting path, as there is with SOI).

A need therefore exists for methodology enabling the formation of an eFUSE that will not create shorts when blown and that is compatible with both SOI and bulk CMOS devices, particularly for 32 nm node and 28 nm node technologies and beyond, and for the resulting device.

SUMMARY

An aspect of the present disclosure is a semiconductor with an eFUSE including embedded silicon germanium (eSiGe) on a polysilicon layer.

Another aspect of the present disclosure is a method of fabricating a semiconductor including forming an eFUSE by forming eSiGe on a polysilicon layer of a gate stack.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of fabricating a semiconductor, the method comprising: forming a shallow trench isolation (STI) region in a substrate; forming a first gate stack on the substrate; forming a second gate stack on an STI region; forming first embedded silicon germanium (eSiGe) on the substrate on first and second sides of the first gate stack; and forming second eSiGe on the second gate stack.

Aspects of the present disclosure include forming each of the first and second gate stacks by: forming a metal electrode, forming a polysilicon layer on the metal electrode, and forming a nitride cap on the polysilicon layer. Further aspects include forming the first and second eSiGe simultaneously. Another aspect includes removing the nitride cap from the second gate stack prior to forming the second eSiGe. Other aspects include forming the second eSiGe and the polysilicon layer of the second gate stack to a total thickness of about 100 nm to about 140 nm. An additional aspect includes forming the polysilicon layer of the second gate stack to a thickness of about 60 nm to about 80 nm. Another aspect includes forming a silicide on the first and second eSiGe. Further aspects include forming the silicide on the second eSiGe to a thickness of about 20 nm to about 30 nm.

Another aspect of the present disclosure is a semiconductor device comprising: a substrate; a first gate stack on the substrate; a shallow trench isolation region on the substrate, separate from the first gate stack; and an eFUSE on the shallow trench isolation region, the eFUSE comprising: a polysilicon layer; and an embedded silicon germanium (eSiGe) on the polysilicon layer.

Aspects include a semiconductor device wherein the eFUSE comprises a metal electrode under the polysilicon layer. Further aspects include an eSiGe on the substrate on first and second sides of the first gate stack. Other aspects include a semiconductor device wherein the eSiGe and polysilicon layer of the eFUSE have a total thickness of about 100 nm to about 140 nm. Additional aspects include a semiconductor device wherein the polysilicon layer of the eFUSE has a thickness of about 60 nm to about 80 nm. Another aspect includes a silicide on the eSiGe of the eFUSE and on the eSiGe on the substrate. A further aspect includes a semiconductor device wherein the silicide of the eFUSE has a thickness of about 20 nm to about 30 nm.

Another aspect of the present disclosure is a method of fabricating a semiconductor device comprising: forming an NMOS gate stack and a PMOS gate stack on a substrate, forming a shallow trench isolation (STI) region in the substrate, forming an eFUSE gate stack on the STI region, each of the NMOS, PMOS, and eFUSE gate stacks comprising a metal electrode and a polysilicon layer on the metal electrode, forming embedded silicon germanium (eSiGe) source/drain regions on first and second sides of the PMOS gate stack, forming eSiGe on the eFUSE gate stack, and forming a silicide on the eSiGe source/drain regions and on the eSiGe on the eFUSE gate stack.

Aspects of the present disclosure include forming the eSiGe and polysilicon layer of the eFUSE gate stack to a total thickness of about 100 nm to about 140 nm. Further aspects include forming the polysilicon layer of the eFUSE gate stack to a thickness of about 60 nm to about 80 nm. Additional aspects include forming the silicide on the eFUSE eSiGe to a thickness of about 20 nm to about 30 nm. Other aspects include forming the eSiGe source drain regions and the eSiGe on the eFUSE gate stack simultaneously.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments.

The present disclosure addresses and solves the shorting problem attendant upon blowing an eFUSE. In accordance with embodiments of the present disclosure, an eFUSE gate stack is formed with an eSiGe layer on the polysilicon layer. Consequently, the distance between the eFUSE debris zone and an underlying metal gate electrode is increased and shorts are avoided. In addition, as the underlying metal gate need not be removed to avoid shorts, gate leakage caused during the removal process is eliminated. Further the methodology is compatible with both SOI and bulk CMOS devices.

Methodology in accordance with embodiments of the present disclosure includes forming a shallow trench isolation (STI) region in a substrate, forming a first gate stack on the substrate, forming a second gate stack on an STI region, forming first embedded silicon germanium (eSiGe) on the substrate on first and second sides of the first gate stack, and forming second eSiGe on the second gate stack. The second eSiGe and the polysilicon layer of the second gate stack may be formed to a total thickness of about 100 nm to about 140 nm, to insure a sufficient buffer zone between eFUSE debris and a metal gate at the bottom of the second gate stack.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 4:
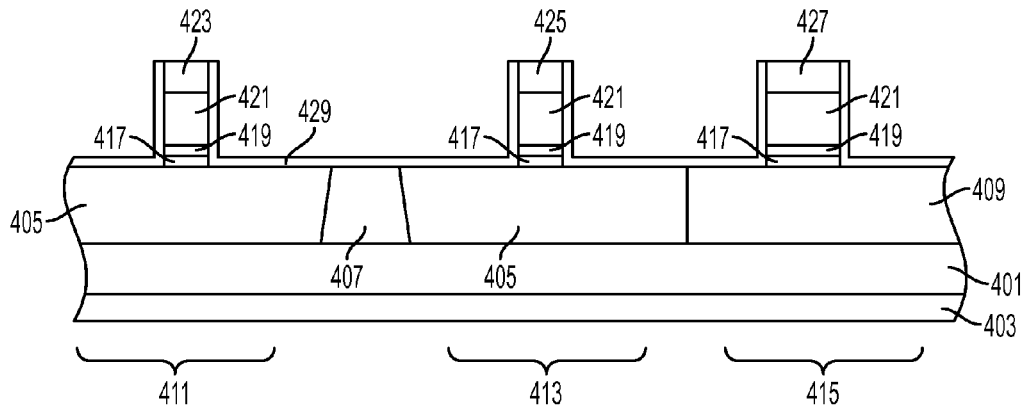
FIGS. 4 through 8 schematically illustrate sequential steps of a method in accordance with an exemplary embodiment.

A process for fabricating an eFUSE according to an embodiment of the present disclosure begins in a similar fashion to typical eFUSE fabrication, except without TiN removal. FIG. 4 illustrates the initial steps that an embodiment of the present disclosure and a typical eFUSE fabrication have in common. For example, a BOX layer 401 is formed on a silicon substrate 403. Active silicon layer 405 is formed on BOX layer 401, and STI regions 407 and 409 are formed in active silicon layer 405.

Next, three gate stacks are formed—a first gate stack for NMOS 411 and a second gate stack for PMOS 413 are formed on active silicon layer 405, separated by STI region 407, and a third gate stack is formed for eFUSE 415 on STI region 409. Formation of each gate stack includes forming a gate oxide layer 417, a TiN layer 419, and a polysilicon layer 421. Polysilicon layer 421 may be formed to a thickness of about 40 nm to about 60 nm, the target polysilicon thickness for 32 nm node and 28 nm node CMOS devices. In addition, nitride caps 423, 425, and 427, e.g., of silicon nitride, are formed for the first (NMOS) gate stack, the second (PMOS) gate stack, and the third (eFUSE) gate stack, respectively, and an encapsulation nitride layer 429 is deposited over the substrate, STI regions, and sidewalls of the three gate stacks.

Figure 5:
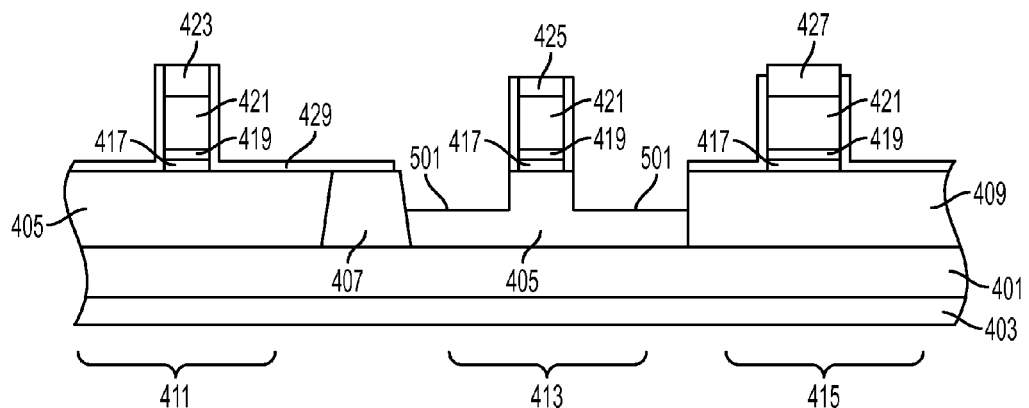

Adverting to FIG. 5, source/drain cavities 501 are formed on each side of the second (PMOS) gate stack, for example by lithographically etching encapsulation nitride layer 429 and active silicon layer 405 between the gate stack and STI regions 407 and 409. During the etching of source/drain cavities 501, nitride cap 425 may become partially etched.

Figure 6:
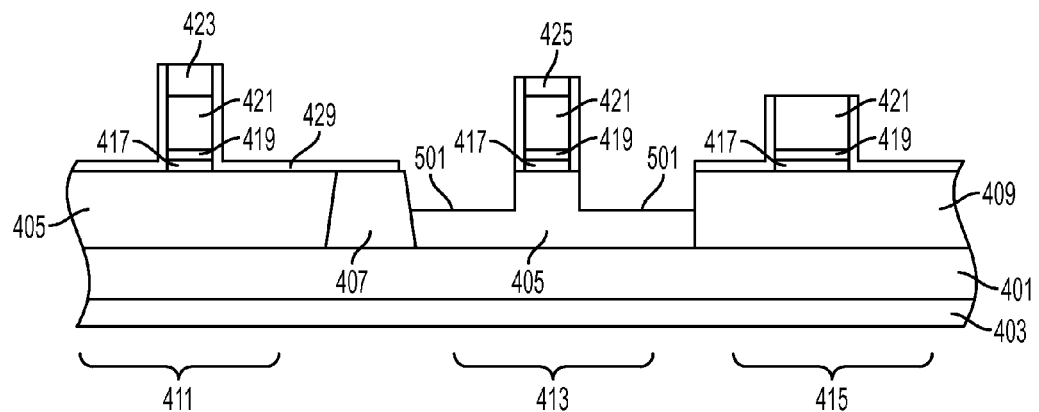
Figure 7:
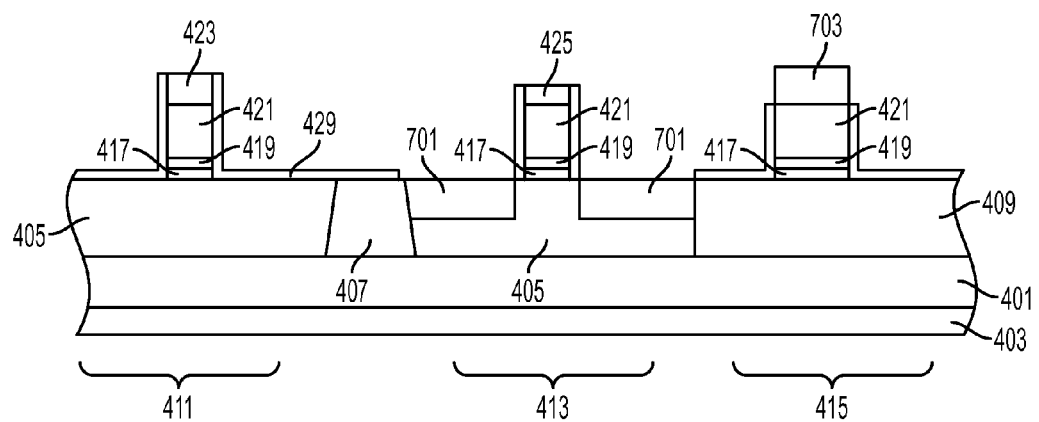
Figure 8:
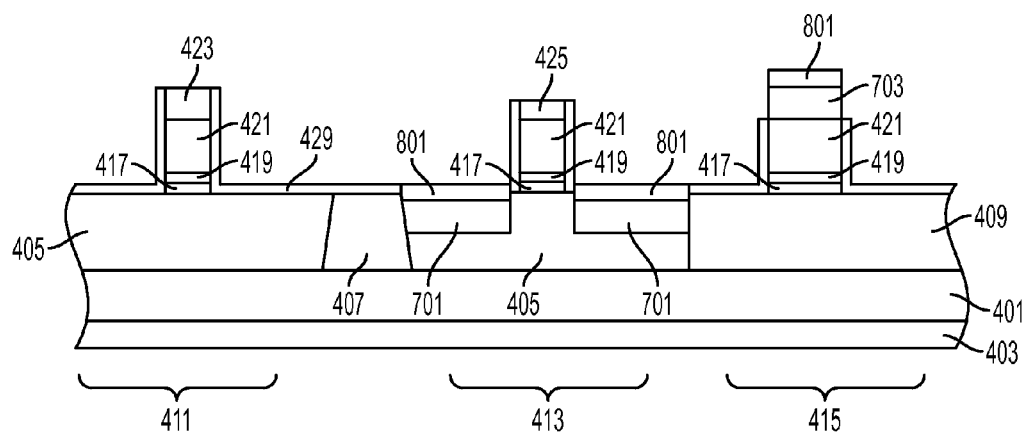

As illustrated in FIG. 6, nitride cap 427 of eFUSE 415 is then etched off, e.g., lithographically, thereby exposing polysilicon layer 421 of eFUSE 415. Turning to FIG. 7, eSiGe is epitaxially grown in cavities 501 to form source/drain regions 701 and is also grown on exposed polysilicon layer 421 of eFUSE 415 to form eSiGe layer 703. The eSiGe may be grown to a thickness of about 60 nm to about 80 nm, e.g., about 60 nm to about 70 nm, for a total silicon thickness on eFUSE 415 of about 100 nm to about 140 nm, e.g., about 100 nm to about 130 nm.

Figure 1A:
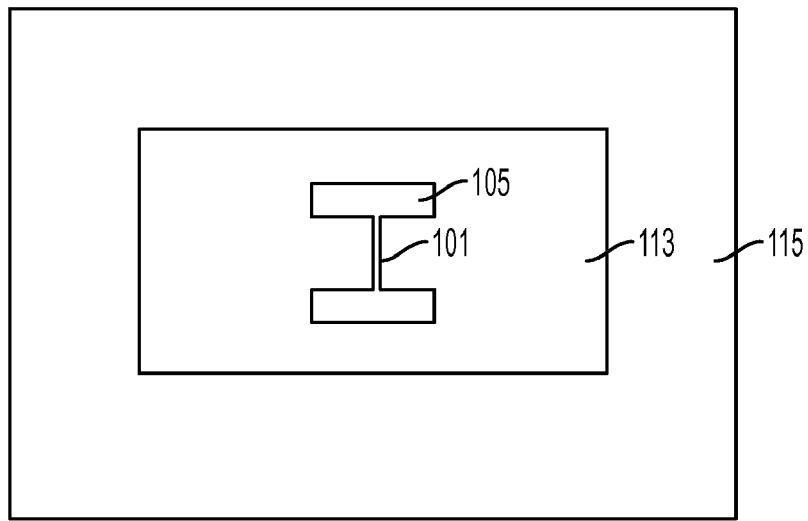
FIGS. 1A and 1B schematically illustrate an eFUSE fabricated on the polysilicon of a transistor gate stack.
Figure 1B:
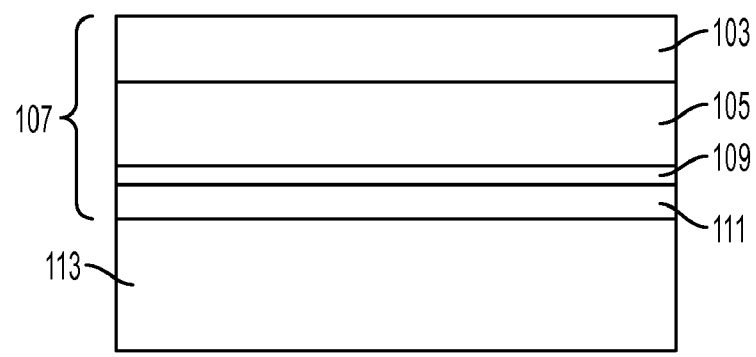
Figure 2:
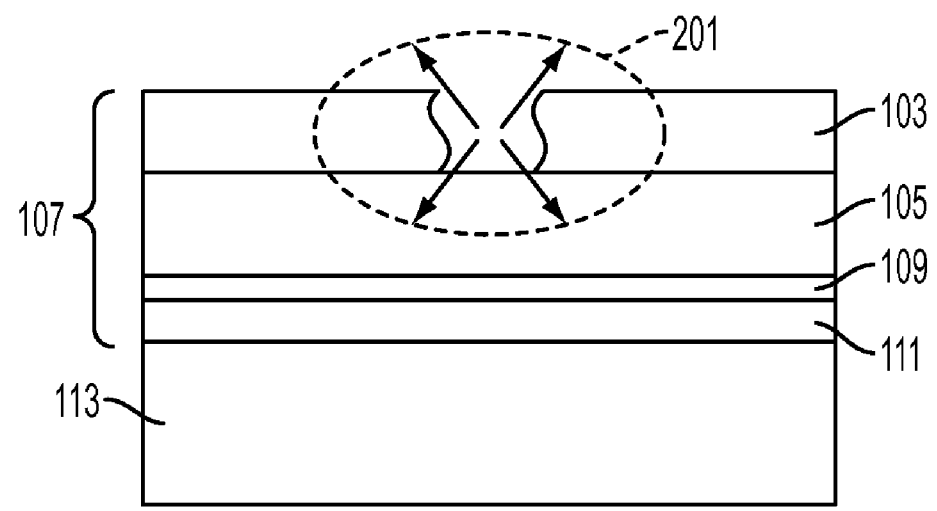
FIG. 2 schematically illustrates the zone of debris in a blown eFUSE.
Figure 3:
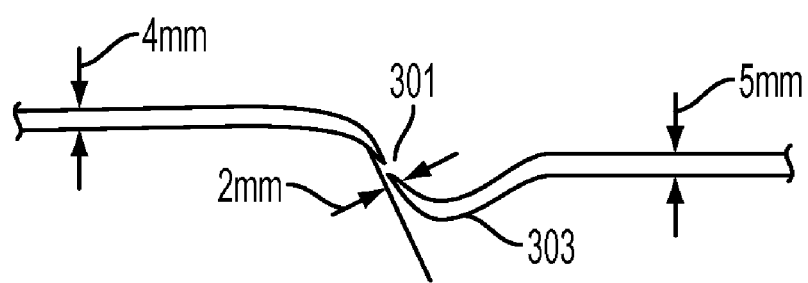
FIG. 3 schematically illustrates a TiN discontinuity formed in the polysilicon/STI divot region during removal of the TiN.
Figure 9:
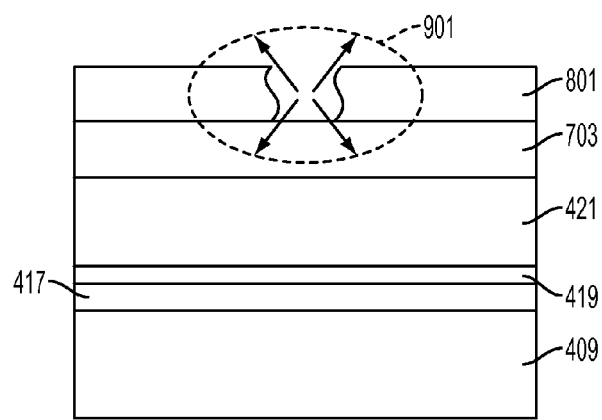
FIG. 9 schematically illustrates the debris zone in a blown eFUSE in accordance with an exemplary embodiment.

Post epitaxial growth, a silicide 801 is formed on eSiGe source/drain regions 701 and on eSiGe layer 703 in a conventional manner. Silicide 801 may be formed to a thickness of about 20 nm to about 30 nm, e.g., about 25 nm. Assuming a silicide thickness of about 25 nm, the remaining silicon on the eFUSE (i.e., polysilicon layer 421 plus unsilicided eSiGe 703), is, therefore, about 75 nm to about 115 nm, e.g., about 75 nm to 105 nm, which is greater than double the minimum required thickness of 35 nm to guarantee that silicide debris does not create a conducting path to the TiN when the eFUSE is blown. FIG. 9 illustrates that debris zone 901 is separated from TiN layer 419 by a greater distance than in current eFUSEs, as was shown in FIG. 2. Provided that eSiGe layer 703 has a thickness of at least 60 nm, a conducting path to the TiN will be prevented, regardless of the thickness of polysilicon layer 421 for technologies beyond the 28 nm node.

The embodiments of the present disclosure can achieve several technical effects, including moving the debris zone of the eFUSE away from the TiN metal gate layer, thereby preventing shorting the TiN, and eliminating a TiN removal step, thereby reducing gate oxide leakage and AC Reff penalty caused during TiN removal. In addition, the improved eFUSE may be formed using a methodology that is compatible for both SOI and bulk CMOS devices, that requires no major process modification to current HKMG CMOS processes, and that requires no additional number of masks (a new mask is required for removing the nitride cap from the eFUSE, but a mask used for removing the TiN layer is eliminated). The present disclosure enjoys industrial applicability in any of various types of highly integrated semiconductor devices using eFUSES, particularly in 32 node and 28 node CMOS technologies and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method of fabricating a semiconductor, the method comprising:
   forming a shallow trench isolation (STI) region in a substrate;
   forming a first gate stack on the substrate by:
      forming a metal electrode,
      forming a polysilicon layer on the metal electrode, and
      forming a nitride cap on the polysilicon layer;
   forming a second gate stack on an STI region by:
      forming a metal electrode,
      forming a polysilicon layer on the metal electrode, and
      forming a nitride cap on the polysilicon layer;
   forming first embedded silicon germanium (eSiGe) on the substrate on first and second sides of the first gate stack; and
   forming second eSiGe on the second gate stack.

2. The method according to claim 1, comprising:
   forming the first and second eSiGe simultaneously.

3. The method according to claim 1, further comprising removing the nitride cap from the second gate stack prior to forming the second eSiGe.

4. The method according to claim 3, comprising forming the second eSiGe and the polysilicon layer of the second gate stack to a total thickness of about 100 nm to about 140 nm.

5. The method according to claim 4, comprising forming the polysilicon layer of the second gate stack to a thickness of about 60 nm to about 80 nm.

6. The method according to claim 4, further comprising forming a silicide on the first and second eSiGe.

7. The method according to claim 6, comprising forming the silicide on the second eSiGe to a thickness of about 20 nm to about 30 nm.

8. A semiconductor device comprising:
   a substrate;
   a first gate stack on the substrate, the first gate stack comprising:
      a metal electrode, and
      a polysilicon layer on the metal electrode;
   a shallow trench isolation region on the substrate, separate from the first gate stack; and
   an eFUSE on the shallow trench isolation region, the eFUSE comprising:
      a metal electrode;
      a polysilicon layer on the metal electrode; and
      an embedded silicon germanium (eSiGe) on the polysilicon layer.

9. The semiconductor device according to claim 8, further comprising an eSiGe on the substrate on first and second sides of the first gate stack.

10. The semiconductor device according to claim 9, wherein the eSiGe and polysilicon layer of the eFUSE have a total thickness of about 100 nm to about 140 nm.

11. The semiconductor device according to claim 10, wherein the polysilicon layer of the eFUSE has a thickness of about 60 nm to about 80 nm.

12. The semiconductor device according to claim 10, further comprising a silicide on the eSiGe of the eFUSE and on the eSiGe on the substrate.

13. The semiconductor device according to claim 12, wherein the silicide of the eFUSE has a thickness of about 20 nm to about 30 nm.

14. A method of fabricating a semiconductor device comprising:
   forming an NMOS gate stack and a PMOS gate stack on a substrate;

forming a shallow trench isolation (STI) region in the substrate;

forming an eFUSE gate stack on the STI region, each of the NMOS, PMOS, and eFUSE gate stacks comprising a metal electrode and a polysilicon layer on the metal electrode;

forming embedded silicon germanium (eSiGe) source/drain regions on first and second sides of the PMOS gate stack;

forming eSiGe on the eFUSE gate stack; and forming a silicide on the eSiGe source/drain regions and on the eSiGe on the eFUSE gate stack.

15. The method according to claim 14, comprising forming the eSiGe and polysilicon layer of the eFUSE gate stack to a total thickness of about 100 nm to about 140 nm.

16. The method according to claim 15, comprising forming the polysilicon layer of the eFUSE gate stack to a thickness of about 60 nm to about 80 nm.

17. The method according to claim 16, comprising forming the silicide on the eFUSE eSiGe to a thickness of about 20 nm to about 30 nm.

18. The method according to claim 14, comprising forming the eSiGe source drain regions and the eSiGe on the eFUSE gate stack simultaneously.

* * * * *